United States Patent
Cline et al.

[11] Patent Number: 5,991,213
[45] Date of Patent: Nov. 23, 1999

[54] SHORT DISTURB TEST ALGORITHM FOR BUILT-IN SELF-TEST

[75] Inventors: Danny R. Cline, Plano, Tex.; Kuong Hua Hii, Singapore, Singapore; James M. Garnett, Wilsonville, Oreg.; Siak Kian Lee, Singapore, Singapore; Tek Yong Lim, Singapore, Singapore; Keat Peng Lee, Singapore, Singapore

[73] Assignee: Texas Instruments Incorporated, Dallas, Tex.

[21] Appl. No.: 09/004,996

[22] Filed: Jan. 9, 1998

Related U.S. Application Data

[63] Continuation-in-part of application No. 08/846,922, Apr. 30, 1997, Pat. No. 5,883,843.

[51] Int. Cl.[6] .................................................. G11C 7/00
[52] U.S. Cl. .......................................... 365/201; 371/21.1
[58] Field of Search .......................... 365/201; 371/21.1, 371/21.2, 21.3, 21.4, 21.5

[56] References Cited

U.S. PATENT DOCUMENTS

| | | | |
|---|---|---|---|
| 5,661,729 | 8/1997 | Miyazaki et al. | 371/21.2 |
| 5,661,732 | 8/1997 | Lo et al. | 371/22.2 |
| 5,668,815 | 9/1997 | Gittinger et al. | 371/21.2 |
| 5,675,545 | 10/1997 | Madhavan et al. | 365/201 |
| 5,771,242 | 6/1998 | Adams et al. | 371/27.1 |
| 5,818,772 | 10/1998 | Kuge | 365/201 |

*Primary Examiner*—David Nelms
*Assistant Examiner*—Anh Phung
*Attorney, Agent, or Firm*—Robby T. Holland; Richard L. Donaldson

[57] ABSTRACT

A short disturb test algorithm for built-in self-test is provided. The short disturb test (108) initially writes a background pattern to all cells in a memory array (24). After verifying the background pattern was written, the opposite of the background pattern is written to a single row of the memory array for a fixed time. After that fixed time has elapsed, the original background pattern is written to the row. The memory array is then refreshed and the next row is written to. After all rows have been written to, the memory array (24) is checked for failures.

23 Claims, 3 Drawing Sheets

FIG. 3

| READ | WRITE | X | Y | | TEST1 | TEST2 | TSET0 | TSET1 | DATA | ED | CKBD | ALT | |
|------|-------|---|---|---|-------|-------|-------|-------|------|----|----|-----|---|
| | | | | TEST1 | TEST2 | | D5 | D4 | D3 | D2 | D1 | D0 | ARRAY ACCESS 140 |
| 1 | 0 | 1 | 1 | 0 | 0 | 0 | 0 | 1 | 0 | 0 | 0 | 0 | PROGRAM CONTROL 142 |

FIG. 4

| 118 | 116 | 114 | 112 | 110 | 108 | 106 | 104 | 102 | 100 |
|-----|-----|-----|-----|-----|-----|-----|-----|-----|-----|
| RIC | WIR | BURN IN | PAGE DISTURB | LONG DISTURB | SHORT DISTURB | YMARCH | XMARCH | PAUSE | GROSS |
| 0 | 0 | 0 | 0 | 0 | 1 | 0 | 0 | 0 | 0 |

62

SHORT DISTURB TEST ALGORITHM FOR BUILT-IN SELF-TEST

This application is a continuation-in-part application of U.S. patent application Ser. No. 08/846,922 filed Apr. 30, 1997, U.S. Pat. No. 5,883,843 assigned to the same party.

TECHNICAL FIELD OF THE INVENTION

This invention relates to the field of built-in self-tests for memory systems and more specifically to a short disturb test algorithm for built-in self-test.

BACKGROUND OF THE INVENTION

In conventional testing of memory device, an external tester supplies control signals such as column address (CAS), row address (RAS), write enable (WE), address signals, and data to the device under test. Outputs from the device under test are sampled by the tester to determine whether the device passes or fails. As memory device density increases, testing time also increases. This increased testing time increases the manufacturing cost of integrated circuit memory devices.

In order to decrease the time it takes to test high density memory devices, parallel read and write schemes have been implemented. One drawback of implemented parallel read and write schemes is that an external tester is required. Also, parallel leads required to test the memory devices in parallel occasionally fail due to cross talk among the leads.

To avoid the drawbacks of parallel read and write schemes, built-in self-test arrangements have been used. The built-in self-test arrangement includes a read only memory that stores test algorithm instructions. The read only memory eliminates the need for external testers as well as parallel leads. One type of test that may be performed by a built-in self-test arrangement is the disturb test. In this disturb test, data is written to read from one or more target cell or cells. If a disturb defect exists, voltage will drain from one cell, disturbing or changing the contents in another cell. Under current testing schemes, as the size of memories increase the time to perform a disturb test increases, as does the external equipment needed to perform the test. Therefore, it is desirable to decrease the length of time required to perform a disturb test on a memory device.

SUMMARY OF THE INVENTION

Accordingly, it may be appreciated that a need has arisen for a short disturb test algorithm for a built-in self-test scheme implemented with a memory device. In accordance with the present invention, a short disturb test algorithm for built-in self-test of a memory device is provided which substantially eliminates or reduces disadvantages and problems associated with current self-test schemes.

In one embodiment of the present invention, a short disturb test algorithm for built-in self-test of a memory device is provided. The short disturb test initially writes a background pattern to all cells in a memory array. After verifying that the background pattern was written, the inverse of the background pattern is written to a single row of the memory array for a fixed time. After the fixed time has elapsed, the original background pattern is rewritten to the row. The memory array is then refreshed and the next row is written to. After all rows have been written to, the memory array is checked for failures.

The present invention provides various technical advantages over current self-test schemes. For example, one technical advantage is to perform a disturb test without external testing equipment. Another technical advantage is to reduce the amount of time required to perform a disturb test Other technical advantages may be readily apparent to one skilled in the art from the following figures, descriptions and claims.

BRIEF DESCRIPTION OF THE DRAWINGS

For a more complete understanding of the present invention and the advantages thereof, reference is now made to the following description taken in conjunction with the accompanying drawings, in which like reference numbers represent like parts, in which:

FIG. 3 illustrates the types of instructions for test algorithms implemented by the built-in self-test;

FIG. 4 illustrates the selection of test algorithms using an enable test circuit of the built-in self-test; and, FIG. 5 is a flowchart that illustrates the operation of the short disturb test.

DETAILED DESCRIPTION OF THE INVENTION

Figure 1:
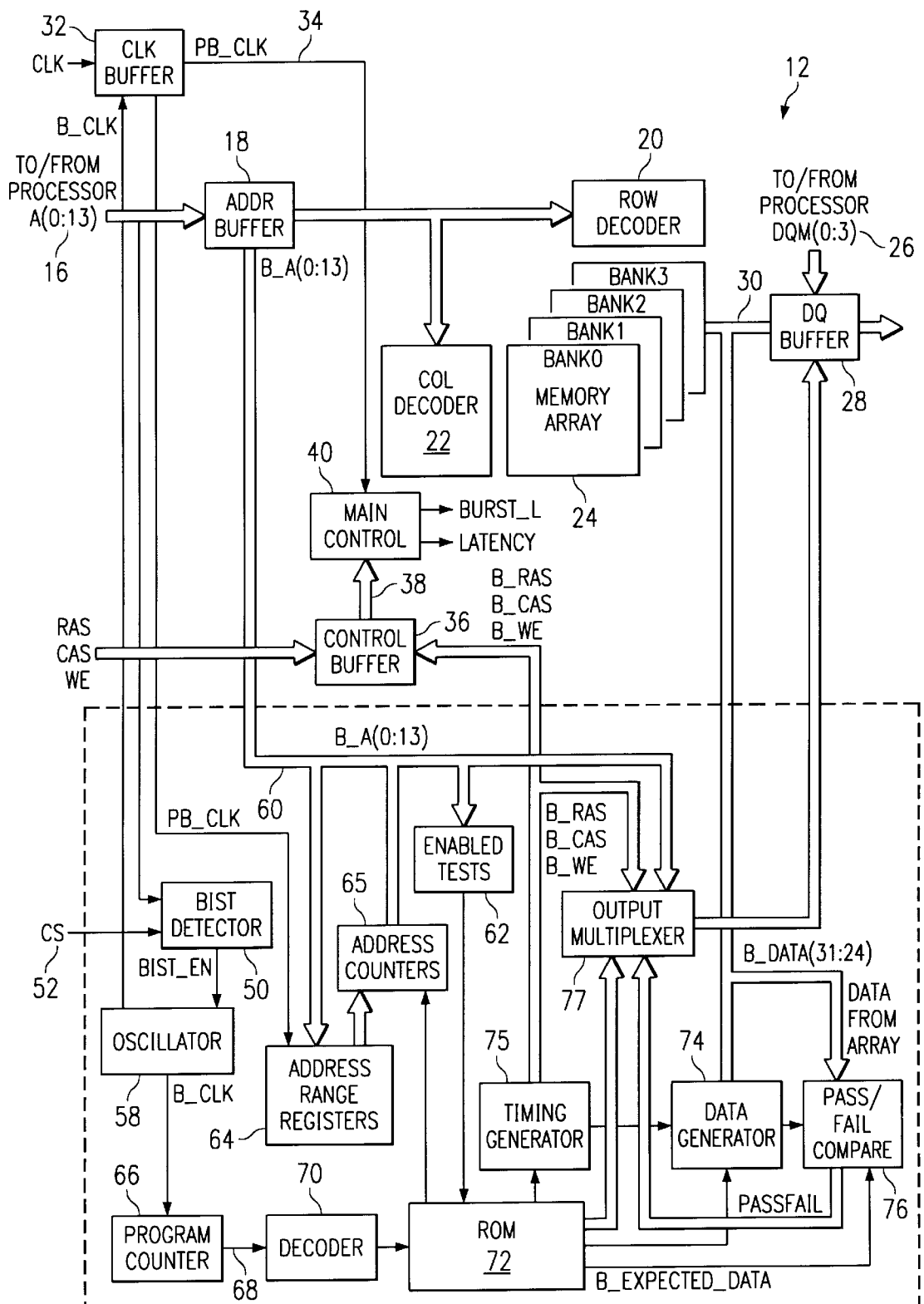
FIG. 1 illustrates a synchronous dynamic random access memory (SDRAM) with a built-in self-test.

FIG. 1 illustrates a synchronous dynamic random access memory (SDRAM) 10 with built-in self-test device 10 in accordance with the teachings of the present invention. SDRAM 10 comprises a conventional memory 12 and a built-in self-test arrangement 14.

Conventional memory 12, in one embodiment, operates as a conventional synchronous dynamic random access memory during normal operation. In test operations, built-in self-test arrangement 14 operates in a self-test mode. All test signals are generated internally to SDRAM 10.

In normal mode, conventional memory 12 operates like a well-known synchronous dynamic random access memory device. A digital processor, such as a microprocessor (not shown) produces row and column address. The row and column addresses are provided on an address bus 16 in a time division multiplexed format for storage in an address buffer 18. After receiving a control signal from the digital processor, the row address and column address are decoded either by row decoder 20 or column decoder 22.

Depending upon the state of the write enable signal, WE, from the digital processor, data is either written into or read out from storage cells located in the banks of a memory array 24. Data which is written into memory array 24 is entered by way of data bus 26. In-coming data is buffered in a data buffer 28 and forwarded to memory array 24 by an internal data bus 30 where it is stored until it is written over or not properly refreshed. Data stored in memory array 24 can be addressed and read out of memory array 24 via internal data bus 30 and data buffer 28 to data bus 26. Typically, data bus 26 is connected to the data receiving and sending terminals of a digital processor such as a microprocessor.

Conventional memory 12, in one embodiment, is a synchronous dynamic random access memory and therefore relies on a system clock for synchronizing its operation with the digital processor, peripheral devices, and control circuitry connected to SDRAM 10. A clock signal CLK is applied to a clock buffer 32 which outputs an internal clock signal 34 for operating memory array 24 during normal operation.

The digital processor applies control signals CAS, RAS, and WE to a control signal buffer 36. During normal operation, these control signals pass through control buffer 36, over to a control bus 38 to a main control unit 40 or for access to memory array 24 through row decoder 20 and column decoder 22. During normal operations, internal system clock signal 34 and the control signals control operation of memory array 24.

The self-test mode is entered if special signal conditions are applied at power up of SDRAM 10. Typically, to initiate the self-test mode, a DC signal will be applied externally to SDRAM 10. In one example, an overvoltage signal to a specific address pin (such as pin A4) of SDRAM 10 would place SDRAM 10 in a self-test condition. Once an overvoltage is applied to a specific pin, a built-in self-test detector circuit 50 responds to this overvoltage by placing built-in self-test arrangement 14 into the self-test mode.

In the self-test mode, built-in self-test arrangement 14 prepares for testing by gathering information on what test to run. The self-test mode is exited when another input is applied to an address lead. In one embodiment, that input applies a high level to control signal 52 (CS) at built-in self-test detector circuit 50. In this embodiment, the self-test mode will be active as long as control signal 52 remains at a high level state. Once control signal 52 falls to a low level state, the self-test mode is exited. Further description of the arrangement and operation of built-in self-test detector 50 can be found in copending U.S. application Ser. No. 08/840,428 entitled 'Procedures For Entry to and Exit From a Built-In-Self-Test Unit in a Semiconductor Memory' now abandoned (TI-22640), hereby incorporated by reference herein.

Upon entering the self-test mode, built-in self-test detector 50 sends a BIST_EN signal to an oscillator 58. In response to the BIST_EN signal, oscillator 58 generates a clock signal B_CLK that is applied to a clock buffer 32 in order to take control of clock buffer 32. Alternatively, an external clock scheme may be used. The internal/external clock option is discussed in copending U.S. application Ser. No. 09/004,998 entitled 'Internal/External Clock Option for Built-In Self-Test' now U.S. Pat. No. 5,875,153 assigned to Texas Instruments (TI-23099), which is hereby incorporated by reference herein.

When in the self-test mode, data from address buffer 18 is transferred via internal address bus 60 to an enabled test circuit 62. Enabled test circuit 62 is a shift register that stores data identifying a specific test, or group of tests, to be run during the self-test mode. Once the selected test data is stored in enabled test circuit 62, a group of addresses may be stored in an address range register 64. Further details of enable test circuit 62 can be found in copending U.S. application Ser. No. 09/005,081 entitled 'Test Enable Control for Built-In Self-Test' (TI-23013) which is hereby incorporated by reference herein. Address data can then be tracked using address counter 65.

Also included is a program counter 66 operable to control test sequences. Upon initiation of self-test mode, program counter 66 is reset to its zero state by clock signal B_CLK. Program counter 66 is a sequential logic arrangement in which the next state of program counter 66 is determined by a current state of program counter 66 and the state of data furnished by a Read-only-Memory (ROM) register.

A Read only Memory decoder 70 receives binary signals from program counter 66 via a bus 68. The binary signals are decoded by ROM address decoder 70. In one embodiment, a one out of sixty-four code technique is used to select a row of data from a read only memory 72. In one embodiment, ROM 72 is a sixty-four row read only memory that stores sequences of instruction for controlling routines. In one embodiment, ten test algorithms are stored in ROM 72. Each row address applied form ROM address decoder 70 to ROM 72 accesses a row of data stored therein in response to clock signal B_CLK. One row of data typically makes up one instruction of an algorithm. It is in one of these instructions that a mask release number for SDRAM 10 is stored.

Instructions are outputted from ROM 72 to a data generator 74 which generates the data to be written to or read from memory array 24. A pass/fail circuit 76 compares the data from memory array 24 with the expected data from ROM 72 and data generator 74. When expected data is equivalent to the data from memory array 24, a pass signal is generated. If not, a fail signal is generated. Fail signals are stored in a register (not pictured) and conveyed through data buffer 28 where the results can be read off a pin of SDRAM 10.

Additionally, instructions from ROM 72 are received by timing generator 75 which generates self-test signals such as B_RAS, B_CAS and B_WE, which are the internally generated equivalent of RAS, CAS, and WE. B_CAS, B_RAS and B_WE instructions pass to control signal buffer 36 when in self-test mode. Output multiplexer 77 takes data involving DRAM addresses, control signals, clock information, and data from pass/fail circuit 76 and presents it to DQ buffer 28.

Figure 2:
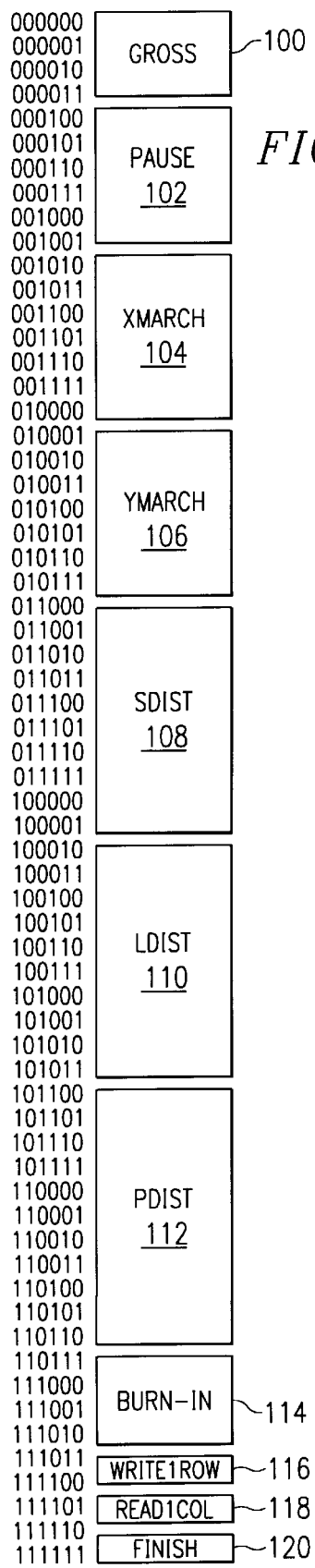
FIG. 2 illustrates read only memory addresses and the corresponding self-tests for the built-in self-test.

FIG. 2 illustrates read only memory 72 addresses and the corresponding self-tests. In the illustrated embodiment, a total of ten self-tests are provided. In this embodiment, a gross test 100 occupies ROM 72 address 000000 to 000011. Gross test 100 is a write and read test from a full array. A pause test 102 occupies address 000100 to 001000. Pause test 102 tests for data retention. An Xmarch test 104 occupies address 001010 to 010000. Xmarch test 104 writes to one column at a time until the entire memory array 24 is filed. A Ymarch test 106 occupies address 010001 to 010111. Ymarch test 106 writes to one row at a time until the entire memory array 24 is filed. A short disturb test 108 occupies address 011000 to 100001. Short disturb test 108 tests adjacent rows using a disturb algorithm having short cycle timing. A long disturb 110 occupies address 100010 to 101011. Long disturb test 110 tests adjacent rows using a disturb algorithm having long cycle timing. A page disturb test 112 occupies address 101100 to 110110. Page disturb test 112 tests adjacent rows in a page mode. A burn in test 114 occupies addresses 110111 to 111010. Burn in test 114 does a full array burn in. Further details of burn in test 114 can be found in copending U.S. application Ser. No. 09/004,973 entitled 'Burn-In Scheme for Memory Systems with Built-In Self-Test' (TI-23823) which is hereby incorporated by reference herein. A write one row test 116 occupies address 111011 to 111100. This test writes to one row. A read one column test 118 occupies address 111101 to 111110. Read one column test 118 reads data from one column. Finally, address 111111 is the end of the self-tests and contains an idle instruction 120 as well as the mask release number for SDRAM device. Further details of storing mask release numbers can be found in copending U.S. application Ser. No. 09/005,539 entitled 'ROM Embedded Mask Release Number for Built-In Self-Test' (TI-23015) which is hereby incorporated by reference herein.

FIG. 3 illustrates the types of instructions for the various self-tests. Two major types of instructions exist. The first of the instruction types are program control instructions 142 and the second of the instruction types are array access instructions 140. Program control instructions 142 control the operation of the built-in self-test while array access instructions 140 determine how cells of memory array 24 are to be accessed and written to and/or read from. In one embodiment, both are twelve bit instructions. In array access instructions 140, Read is a command to read a cell, Write is a command to write to a cell, X determines if columns are to be accessed, Y determines if rows are to be accessed, Tset 0 and Tset 1 set the timing of the self-test, Dat determines what data is to be used, ED is the expected data, Ckbd sets the pattern to be read or written, and Alt determines if the address is to be incremented or decremented. For example, if an array access instruction 140 of 101100010000 is given, that would correspond to read X and Y using a specific time set with an expected data of 0.

For program control instructions 142, the first six bits list an instruction and the last six bits are a ROM 72 address. The first four bits of the first six bits are typically 0, and the next two determine the program control type, while the last six bits determine the ROM 72 address to jump to if the first six bits require a jump. The very last instruction in ROM 72 is idle instruction 120 which signals the end of the built-in self-test. For example, idle instruction 120 is 010011 for the first six bits. When this instruction is reached, the built-in self-test is over and the program control sits at an idle state until built-in self-test is exited and normal mode resumes. Since an idle instruction logically does not require a jump, the last 6 bits are unused. Thus, the last six bits of idle instruction 120 may be used in any manner such as for storing the mask release number for SDRAM 10.

FIG. 4 illustrates the selection of test algorithms using enable test circuit 62. In one embodiment of the present invention, enabled test circuit 62 comprises a fourteen bit shift register of which ten of the bits correspond to the ten self-tests as illustrated in FIG. 2. FIG. 4 only illustrates the ten registers corresponding to the ten self-tests stored in ROM 72. At power up, a one is loaded into enable test circuit 62 for each self-test that is to be run and a zero loaded for each self-test that is to be skipped. Thus, in the present invention, short disturb test 108 has a one loaded in the register of enable test circuit 62, indicating that short disturb test 108 will be performed. Further information on enabled test circuit 62 and its application can be found in copending U.S. application Ser. No. 09/005,398 entitled 'An Embedded Timing Generator for Self-Clocked Built-In Self-Test' (TI-23824) which is hereby incorporated herein by reference.

Therefore, in operation, it is first determined if a particular self-test is to be run by checking the proper register corresponding to the self-test in enable test circuit 62. Since enable test circuit 62 is a shift register and is synchronized with the list of self-tests in ROM 72, the first test is checked against the first bit in enable test circuit 62. If that bit is a zero, control jumps to the second test and data in enable test circuit 62 shifts to the right one bit. Control jumps continue until enable test circuit 62 indicates that a self-test is to be performed. The identified self-test is then, for example, a short disturb test 108 is enabled and its corresponding position within enable test circuit 62 is reached showing an enable "I" indication, performance of short disturb test 108 is initiated.

Figure 5:
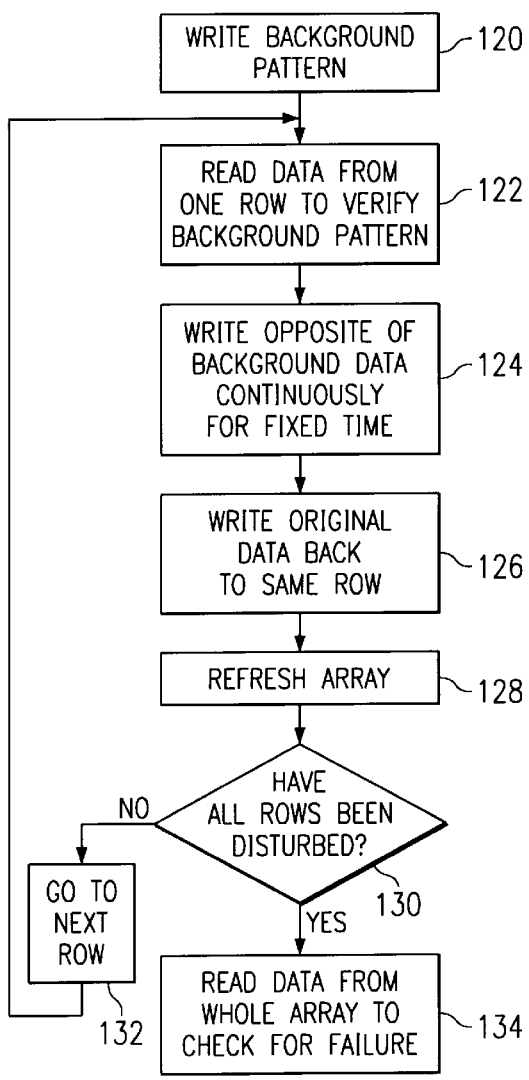

FIG. 5 is a flowchart that illustrates the operation of short disturb test 108. In step 120, a background pattern is written to each cell in memory array 24. This pattern is typically either all ones or all zeroes or a pattern of ones and zeroes. In step 122, data is read from one row, starting with the first row, to verify that the background pattern was correctly written. Next, in step 124, the inverse of the background pattern is continuously written to one row, starting with the first row, for a fixed time. This time is known as the disturb time. In one embodiment, the disturb time is 80 milliseconds. Since the disturb process takes time, the entire array is refreshed in step 126. In step 128, the original pattern is written back to that row. In step 130, it is determined if all rows have been disturbed. If not, the next row is moved to and the process for that row starts over in step 122. If all rows have been disturbed, in step 134, data is checked from the whole memory array 24 to check for any failures. Failures occur when cells have a value different then the original background data stored within the cell.

Thus, it is apparent that there has been provided, in accordance with the present invention, a short disturb test algorithm for built-in self-test that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. A method for performing a short disturb test comprising the steps of:

writing a background pattern to all cells to be tested in a memory array;

writing the inverse of the background pattern to a single row repeatedly for a fixed time;

writing the background pattern to the row;

repeating the steps of writing the inverse of the background pattern repeatedly for a fixed time and writing the background pattern to the row for each row in the memory array; and checking the memory array for failures.

2. A built-in self-test system for performing short disturb tests on a memory array, comprising:

a memory array; and a built-in self-test area comprising:

a non-volatile memory for storing a plurality of test algorithms;

a data generator operable to receive data based on at least one of the plurality of test algorithms from the non-volatile memory and to generate read and write data operations on the memory array;

wherein at least one of the plurality of test algorithms is a short disturb test algorithm.

3. The system of claim 2, wherein the memory system further comprises a test enable register for selectively enabling the short disturb test.

4. The system of claim 2, wherein the short disturb test comprises writing a background pattern to cells in a memory array, writing the inverse of the background pattern in a row repeatedly for a fixed time, and then checking for failures.

5. The system of claim 2, wherein the memory array is a synchronous dynamic random access memory.

6. Apparatus for performing disturb tests on a memory array comprising:

a test circuit having at least one input and at least one output, the test circuit capable of generating one of a plurality of test algorithms at its output;

a test data generator having an input coupled to the at least one output from the test circuit and having an output coupled to the memory array, the test data generator generating read and write data operations on the memory array based on the test algorithm output from the test circuit; and wherein the test circuit and test data generator are located on an integrated circuit along with the memory array; and wherein one of the plurality of test algorithms is a disturb test algorithm.

7. The apparatus of claim 6, wherein the test circuit comprises a read-only memory.

8. The apparatus of claim 6, wherein the disturb test algorithm is a short disturb algorithm.

9. The apparatus of claim 6, wherein the disturb algorithm is a long disturb algorithm.

10. The apparatus of claim 6, wherein the disturb algorithm is a page disturb algorithm.

11. The apparatus of claim 6 further comprising a test register having an input coupled to at least one input to the integrated circuit and an output coupled to the at least one input of the test circuit, the output of the test register being operable to selectively enable at least one of the plurality of test algorithms.

12. The apparatus of claim 6 further comprising a built-in self test detector responsive to at least one input signal to the integrated circuit to control operation of the device alternatively in either normal mode or a self-test mode.

13. The apparatus of claim 6 further comprising a pass/fail circuit coupled to the memory array and also coupled to the test data generator, the pass/fail circuit comparing data read from the memory array with the expected data from the test circuit and the test data generator.

14. The apparatus of claim 12 further comprising address registers coupled to at least one input signal to the integrated circuit, the address registers storing the range of addresses to be tested in at least one of the plurality of test algorithms.

15. The apparatus of claim 6 wherein the memory array is a dynamic random access memory array.

16. The apparatus of claim 8 wherein the short disturb test algorithm comprises writing a background pattern to cells in a memory array, writing the inverse of the background pattern in a row repeatedly for a fixed time, and then checking for failures.

17. The apparatus of claim 16, wherein the short disturb test algorithm further comprises writing the background pattern to the row after writing the inverse of the background pattern repeatedly for a fixed time, and then refreshing the memory array.

18. The system of claim 4, wherein the short disturb test further comprises writing the background pattern to the row after writing the inverse of the background pattern repeatedly for a fixed time, and then refreshing the memory array.

19. The method of claim 1 wherein the memory array is a dynamic random access memory array.

20. The method of claim 19 further comprising the step of refreshing the memory array after writing the background pattern to the row and before repeating the step of writing the inverse of the background pattern repeatedly for a fixed time.

21. The method of claim 19 further comprising the step of refreshing the memory array after writing the inverse of the background pattern repeatedly to the row for a fixed time and before writing the background pattern to the row.

22. The method of claim 1, further comprising the step of verifying that the background pattern is properly written prior to writing the inverse of the background pattern repeatedly to a single row for a fixed time.

23. The method of claim 1, wherein the short disturb test is stored in built-in self-test circuitry on the same integrated circuit as the memory array.

\* \* \* \* \*